(12) United States Patent
Lin et al.

(10) Patent No.: US 11,394,172 B2
(45) Date of Patent: Jul. 19, 2022

(54) LASER DRIVER WITH HIGH-SPEED AND HIGH-CURRENT AND INTEGRATED CIRCUIT THEREOF

(71) Applicants: ANHUI TRANSILICA MICROELECTRONICS CO., LTD., Hefei (CN); JIANGSU KEDA HENGXIN SEMICON TECH CO., LTD., Suzhou (CN)

(72) Inventors: Fujiang Lin, Singapore (SG); Ahmed Wahba Abdalla Elsayed, Zagazig (EG); Xi Li, Hefei (CN)

(73) Assignees: ANHUI TRANSILICA MICROELECTRONICS CO., LTD., Hefei (CN); JIANGSU KEDA HENGXIN SEMICON TECH CO., LTD., Suzhou (CN)

( * ) Notice: Subject to any disclaimer, the term of this patent is extended or adjusted under 35 U.S.C. 154(b) by 112 days.

(21) Appl. No.: 17/090,048

(22) Filed: Nov. 5, 2020

(65) Prior Publication Data

US 2021/0151951 A1 May 20, 2021

(30) Foreign Application Priority Data

Nov. 14, 2019 (CN) .......................... 201911114311.X

(51) Int. Cl.
*H01S 5/042* (2006.01)
*H03K 17/687* (2006.01)

(52) U.S. Cl.
CPC ......... *H01S 5/042* (2013.01); *H03K 17/6871* (2013.01)

(58) Field of Classification Search
CPC .......................... H01S 5/0261; H03K 17/6871
See application file for complete search history.

(56) References Cited

U.S. PATENT DOCUMENTS

| 2005/0147136 | A1* | 7/2005 | Pobanz | ................. | G02F 1/0121 |
| | | | | | 372/26 |
| 2010/0183318 | A1* | 7/2010 | Tanaka | ................. | H04B 10/504 |
| | | | | | 398/201 |

(Continued)

FOREIGN PATENT DOCUMENTS

| CA | 2236785 A1 * | 5/1997 |
| EP | 3866342 A1 * | 8/2021 |

*Primary Examiner* — Metasebia T Retebo
(74) *Attorney, Agent, or Firm* — Hemisphere Law, PLLC; Zhigang Ma

(57) ABSTRACT

A high-speed high-current laser driver integrated circuit is invented. The laser driver includes an input stage circuit, a pre-drive circuit, a negative capacitance circuit, three parallel-connected output stages, and an active reverse termination circuit. A pair of voltage signals $V_{IP}$, $V_{IN}$ are applied to the input stage circuit which amplifies these input signals to a pair of output voltage signals $V_{1IP}$, $V_{1IN}$. Then the voltage signals $V_{1IP}$, $V_{1IN}$ are amplified by the pre-drive circuit to a pair of voltage signals $V_+$, $V_-$ to the output stage circuit, and finally, a pair of modulated current signals $I_{OP}$, $I_{ON}$ are generated by the output stage circuit. The present invention does not use terminal resistance in the output stage circuit, so the power consumption of the circuit is much lower than that of the traditional circuit.

20 Claims, 4 Drawing Sheets

(56) References Cited

U.S. PATENT DOCUMENTS

2015/0341025 A1* 11/2015 Kong .................. H03F 3/45188
                                                              327/382
2020/0177143 A1* 6/2020 Sugimoto ........... H03F 3/45098
2021/0135641 A1* 5/2021 Shen ....................... H03F 3/68

* cited by examiner

LASER DRIVER WITH HIGH-SPEED AND HIGH-CURRENT AND INTEGRATED CIRCUIT THEREOF

FIELD OF THE INVENTION

The present invention relates to the field of optoelectronic integrated circuit (OEIC), in particular to a laser driver integrated circuit that simultaneously supports high-speed and high-current operation, and more particularly to a an integrated circuit.

BACKGROUND OF THE INVENTION

With the rapid development of communication networks, there is a high demand for optical fiber communication networks with high bandwidth and low loss. A laser driver is one of the key components in an optical communication system as it controls the quality of the transmitted optical signal. The driver circuit bandwidth and modulation current have significant impacts on the quality of the output optical signal. In order to work at high-speeds without inter-symbol interference (ISI), the laser driver must have sufficient bandwidth. In long-haul communication, the driver circuit must deliver high modulation current to the laser diode for a large extinction ratio. Due to the mismatch between the laser's input impedance and the (printed circuit board) PCB's transmission line impedance, a termination network (such as passive on-chip passive resistors) is usually required to absorb signal reflections from the laser side. If the terminal resistors and the input resistance of the laser are perfectly matched with the characteristic impedance of the transmission line, the reflected signal can be completely absorbed. But half of the output current will be wasted through the terminal resistors, resulting in a large power waste.

SUMMARY OF THE INVENTION

The object of the present invention is to provide a high-speed high current laser driver integrated circuit to solve the problem of large power consumption waste caused by using passive terminal resistors. This design does not use any passive back termination resistor, so the power consumption of the circuit is much lower compared to the traditional circuit. Another object of the present invention provides an integrated circuit encapsulated by the laser driver with high-speed and high-current to avoid the large consumption waste.

The present invention provides a laser driver with high-speed and high-current, includes:
an input stage circuit;
a pre-drive circuit, being electrically connected to the out put ends of the input stage circuit;
a fully differential negative capacitance circuit, being electrically connected to the output ends of the pre-drive circuit;
a output stage circuit being electrically connected to the out put ends of the pre-drive circuit; and
an active reverse termination circuit; the input ends of the active reverse termination circuit being electrically connected to the input ends of the output stage circuit, and the output ends of the active reverse termination circuit being electrically connected to the output ends of the output stage circuit.

In the laser driver of the present invention, the active reverse termination circuit includes:

a pair of transistors $M_{5A}$, $M_{5B}$; the gate of the transistor $M_{5A}$ is electrically connected to the positive output end of the pre-drive circuit, the gate of the transistor $M_{5B}$ is electrically connected to the negative output end of the pre-drive circuit; the sources of the transistors $M_{5A}$, $M_{5B}$ are electrically connected to a tail current source $I_{M1}/k$;

a pair of transistors $M_{6A}$, $M_{6B}$; the gate of the transistor $M_{6A}$ is electrically connected to the positive output end of the pre-drive circuit, the gate of the transistor $M_{6B}$ is electrically connected to the negative output end of the pre-drive circuit; the sources of the transistors $M_{6A}$, $M_{6B}$ are electrically connected to a tail current source $I_{M2}/k$;

a pair of transistors $M_{7A}$, $M_{7B}$; the gate of the transistor $M_{7A}$ is electrically connected to the positive output end of the pre-drive circuit, the gate of the transistor $M_{7B}$ is electrically connected to the negative output end of the pre-drive circuit; the sources of the transistors $M_{7A}$, $M_{7B}$ are electrically connected to a tail current source $I_{M3}/k$;

a pair of transistors $M_{S1}$, $M_{S2}$; the drains of the transistors $M_{5A}$, $M_{6A}$, $M_{7A}$ are electrically connected to the gate of the transistor $M_{S2}$, the drains of the transistors $M_{5B}$, $M_{6B}$, $M_{7B}$ are electrically connected to the gate of the transistor $M_{S1}$; the source of the transistor $M_{S1}$ is electrically connected to a tail current source $I_{B1}$, the source of the transistor $M_{S2}$ is electrically connected to a tail current source $I_{B2}$;

a pair of resistors $R_{3A}$, $R_{3B}$; one end of these resistors is connected with the drains of the transistors $M_{S1}$, $M_{S2}$ to a supply voltage $V_{DD}$; the other ends of the resistors $R_{3A}$ and $R_{3b}$ are connected to the gates of the $M_{S2}$ and $M_{S1}$, respectively; and a pair of capacitors $C_1$, $C_2$; one end of the capacitor $C_1$ is electrically connected to the source of the transistor $M_{S2}$, the other end of capacitor $C_1$ is directly connected to a output current terminal $I_{OP}$; one end of the capacitor $C_2$ is electrically connected to the source of the transistor $M_{S1}$, the other end of capacitor $C_2$ is directly connected to a output terminal $I_{ON}$.

In the laser driver of the present invention, the input stage circuit includes:

a transistor $M_D$; the gate and drain of the transistor $M_D$ are electrically connected to the voltage source $V_{DD}$;

a pair of transistors $M_{1A}$, $M_{1B}$; the gates of the transistors $M_{1A}$, $M_{1B}$ respectively are used as the input ends of the input stage circuit, the drains of transistors $M_{1A}$, $M_{1B}$ are electrically connected to input ends of the pre-drive circuit, the sources of the $M_{1A}$ and $M_{1B}$ are connected to a tail current source $I_1$; and a plurality of resistors $R_{INA}$, $R_{INB}$, $R_{1A}$, and $R_{1B}$; one end of the resistor $R_{INA}$ is electrically connected to a voltage source $V_{CM}$, the other end of the resistor $R_{INA}$ is electrically connected to the gate of the transistor $M_{1A}$; one end of the resistor $R_{INB}$ is electrically connected to the voltage source $V_{CM}$, the other end of the resistor $R_{INB}$ is electrically connected to the gate of the transistor $M_{1B}$; one end of the resistor $R_{1A}$ is electrically connected to the drain of the transistors $M_{1A}$, the other end of the resistor $R_{1A}$ is electrically connected to the source of the transistor $M_D$; one end of the resistor $R_{1B}$ is electrically connected to the drain of the transistors $M_{1B}$, the other end of the resistor $R_{1B}$ is electrically connected to the source of the transistor $M_D$.

In the laser driver of the present invention, both resistors $R_{INA}$ and $R_{INB}$ are 50 ohms.

In the laser driver of the present invention, the pre-drive circuit includes:

a pair of transistors $M_{2A}$, $M_{2B}$; the gates of the transistors $M_{2A}$, $M_{2B}$ are electrically connected to the drains of transistors $M_{1A}$, $M_{1B}$ respectively, the drains of the transistors $M_{2A}$, $M_{2B}$ are electrically connected to input ends of the output stage circuit, the sources of the transistors $M_{2A}$, $M_{2B}$ are connected to a tail current source $I_2$; and a pair of resistors $R_{2A}$, $R_{2B}$; one end of the resistors $R_{2A}$ is connected to the drain of the transistors $M_{2A}$, one end of the resistors $R_{2B}$ is connected to the drain of the transistors $M_{2B}$, the other ends of the resistors $R_{2A}$, $R_{2B}$ are connected to the voltage source $V_{DD}$.

In the laser driver of the present invention, the negative capacitance circuit includes:

a pair of transistors $M_{3A}$, $M_{3B}$; the gate of the transistors $M_{3A}$ and the drain of the transistors $M_{3B}$ are electrically connected together to the positive output end of the pre-drive circuit, the gate of the transistors $M_{3B}$ and the drain of the transistors $M_{3A}$ are electrically connected together to the negative output end of the pre-drive circuit, the sources of the transistors $M_{3A}$, $M_{3B}$ are connected to a pair of tail current sources $I_{3A}$, $I_{3B}$ respectively; and a capacitor $C_c$; two ends of the capacitor $C_c$ are connected to the tail current sources $I_{3A}$, $I_{3B}$.

In the laser driver of the present invention, the output stage circuit includes:

a pair of transistors $M_{4A}$, $M_{4B}$; the sources of the transistors $M_{4A}$, $M_{4B}$ are electrically connected together to a tail current source $I_{M1}$, the drains of the transistors $M_{4A}$, $M_{4B}$ represent the output ends of output current terminals $I_{OP}$, $I_{ON}$; the gate of the transistor $M_{4A}$ is electrically connected to the positive output end of the pre-drive circuit, and the gate of the transistor $M_{4B}$ is electrically connected to the negative output end of the pre-drive circuit; and a pair of transistors $M_{CA}$, $M_{CB}$; the source and drain of the transistor $M_{CA}$ are connected together to the output end of the output current terminal $I_{ON}$, and the source and drain of the transistor $M_{CB}$ are connected together to the output end of the output current terminal $I_{OP}$; the gate of the transistor $M_{CA}$ is electrically connected to the positive output end of the pre-drive circuit, and the gate of the transistor $M_{CB}$ is electrically connected to the negative output end of the pre-drive circuit.

In the laser driver of the present invention, the output stage circuit is a three parallel connected output stages circuit.

In the laser driver of the present invention, the first output stage is directly connected to the output of the pre-drive circuit while the second and the third output stages are connected to the output of pre-drive using switching circuits.

In the laser driver of the present invention, each switching circuit includes:

a pair of transistors $M_{S3}$, $M_{S4}$; the gates of the transistors $M_{S3}$, $M_{S4}$ receive a switch control signal $V_s$, the sources of the transistors $M_{S3}$, $M_{S4}$ respectively electrically are connected to the inputs of the second output stage via two input ends of the corresponding switching circuit, the drains of the transistors $M_{S3}$, $M_{S4}$ are electrically connected to the output ends of the pre-drive circuit respectively.

In the laser driver of the present invention, one of the witching circuits is controlled by a switch control signal $V_{s1}$, and the other of the switching circuits is controlled by a switch control signal $V_{s2}$.

In the laser driver of the present invention, when the switch control signals $V_{s1}$, $V_{s2}$ are 0, the output modulation current can be adjusted from 10 mA to 50 mA; when the switch control signal $V_{s1}$ is 1 and the switch control signal $V_{s2}$ is 0, the output modulation current can reach 100 mA; when the switch control signals $V_{s1}$, $V_{s2}$ are 1, the output modulation current is as high as 150 mA.

The present invention provides a laser driver with high-speed and high-current, includes:

an input stage circuit which receives a pair of fully differential input voltage signals, $V_{IP}$, $V_{IN}$, then, adjusting the common-mode output voltage of signals $V_{1IP}$, $V_{1IN}$, such that they could be applied to the subsequent stage;

a pre-drive circuit, for amplifying the voltage signals $V_{1IP}$, $V_{1IN}$ to a pair of voltage signals $V_+$, $V_-$;

a fully differential negative capacitance circuit that is directly connected to the output terminals of the pre-drive circuit, $V_+$, $V_-$; the negative capacitance circuit generates a negative capacitor to reduce the input capacitance of the output stage circuit;

an output stage circuit, for receiving the voltage signals $V_+$, $V_-$, then outputting a pair of modulated current signals $I_{OP}$, $I_{ON}$; and an active reverse termination circuit, for absorbing the reflected wave caused by the output mismatch of the output stage circuit.

In the laser driver of the present invention, the active reverse termination circuit includes:

a pair of transistors $M_{5A}$, $M_{5B}$; the gate of the transistor $M_{5A}$ receives the voltage signal $V_+$, the gate of the transistors $M_{5B}$ receives the voltage signal $V_-$; the sources of the transistors $M_{5A}$, $M_{5B}$ are electrically connected to a tail current source $I_{M1}/k$;

a pair of transistors $M_{6A}$, $M_{6B}$; the gate of the transistor $M_{6A}$ receives the voltage signal $V_+$, the gate of the transistors $M_{6B}$ receives the voltage signal $V_-$; the sources of the transistors $M_{6A}$, $M_{6B}$ are electrically connected to a tail current source $I_{M2}/k$;

a pair of transistors $M_{7A}$, $M_{7B}$; the gate of the transistor $M_{7A}$ receives the voltage signal $V_+$, the gate of the transistors $M_{7B}$ receives the voltage signal $V_-$; the sources of the transistors $M_{7A}$, $M_{7B}$ are electrically connected to a tail current source $I_{M3}/k$;

a pair of transistors $M_{S1}$, $M_{S2}$; the drains of the transistors $M_{5A}$, $M_{6A}$, $M_{7A}$ are electrically connected to the gate of the transistor $M_{S2}$, the drains of the transistors $M_{5B}$, $M_{6B}$, $M_{7B}$ are electrically connected to the gate of the transistor $M_{S1}$; the source of the transistor $M_{S1}$ is electrically connected to a tail current source $I_{B1}$, the source of the transistor $M_{S2}$ is electrically connected to a tail current source $I_{B2}$;

a pair of resistors $R_{3A}$, $R_{3B}$; one end of these resistors is connected with the drains of the transistors $M_{S1}$, $M_{S2}$ to a supply voltage $V_{DD}$; the other ends of the resistors $R_{3A}$ and $R_{3b}$ are connected to the gates of the $M_{S2}$ and $M_{S1}$ respectively; and a pair of capacitors $C_1$, $C_2$; one end of the capacitor $C_1$ is electrically connected to the source of the transistor $M_{S2}$, the other end of capacitor $C_1$ is directly connected to the output current terminal $I_{OP}$; one end of the capacitor $C_2$ is electrically connected to the source of the transistor $M_{S1}$, the other end of capacitor $C_2$ is directly connected to the output terminal $I_{ON}$.

In the laser driver of the present invention, the input stage circuit includes:

a transistor $M_D$; the gate and drain of the transistor $M_D$ are electrically connected to the voltage source $V_{DD}$;

a pair of transistors $M_{1A}$, $M_{1B}$; the gates of the transistors $M_{1A}$, $M_1$, respectively receive the voltage signals $V_{IP}$, $V_{IN}$, the output voltage signals $V_{1IP}$ and $V_{1IN}$ are taken at the drains of $M_{1A}$, $M_{1B}$ respectively, the sources of the $M_{1A}$ and $M_{1B}$ are connected to a tail current source $I_1$; and a plurality of resistors $R_{INA}$, $R_{INB}$, $R_{1A}$, and $R_{1B}$; one end of the resistor $R_{INA}$ is connected to a voltage source $V_{CM}$, the other end of the resistor $R_{INA}$ is connected to the gate of the transistor $M_{1A}$; one end of the resistor $R_{INB}$ is connected to the voltage source $V_{CM}$, the other end of the resistor $R_{INB}$ is connected to the gate of the transistor $M_{1B}$; one end of the resistor $R_{1A}$ is connected to the drain of the transistors $M_{1A}$, the other end of the resistor $R_{1A}$ is connected to the source of the transistor $M_D$; one end of the resistor $R_{1B}$ is connected to the drain of the transistors $M_{1B}$, the other end of the resistor $R_{1B}$ is connected to the source of the transistor $M_D$.

In the laser driver of the present invention, the pre-drive circuit includes:

a pair of transistors $M_{2A}$, $M_{2B}$; the gates of the transistors $M_{2A}$, $M_{2B}$ receive the voltage signals $V_{1IP}$, $V_{1IN}$ respectively, the drains of the transistors $M_{2A}$, $M_{2B}$ represent the output voltage signals $V_+$, $V_-$ respectively, the sources of the transistors $M_{2A}$, $M_{2B}$ are connected to a tail current source $I_2$; and a pair of resistors $R_{2A}$, $R_{2B}$; one end of the resistors $R_{2A}$ is connected to the drain of the transistors $M_{2A}$, one end of the resistors $R_{2B}$ is connected to the drain of the transistors $M_{2B}$, the other ends of the resistors $R_{2A}$, $R_{2B}$ are electrically connected to the voltage source $V_{DD}$.

In the laser driver of the present invention, the negative capacitance circuit includes:

a pair of transistors $M_{3A}$, $M_{3B}$; the gates of the transistors $M_{3A}$, $M_{3B}$ receive the voltage signals $V_+$, $V_-$, the drains of $M_{3A}$ and $M_{3B}$ receive the voltage signals $V_-$, $V_+$ respectively, the sources of the transistors $M_{3A}$, $M_{3B}$ are electrically connected to a pair of tail current sources $I_{3A}$, $I_{3B}$ respectively; and a capacitor $C_c$; two ends of the capacitor $C_c$ are electrically connected to the tail current sources $I_{3A}$, $I_{3B}$.

In the laser driver of the present invention, the output stage circuit includes:

a pair of transistors $M_{4A}$, $M_{4B}$; the sources of the transistors $M_{4A}$, $M_{4B}$ are connected together to a tail current source $I_{M1}$, the drains of the transistors $M_{4A}$, $M_{4B}$ represent the output ends of the current signals $I_{OP}$, $I_{ON}$; the gate of the transistor $M_{4A}$ receives the voltage signal $V_+$, and the gate of the transistor $M_{4B}$ receives the voltage signal $V_-$; and a pair of transistors $M_{CA}$, $M_{CB}$; the source and drain of the transistor $M_{CA}$ are connected together to the output end of the current signal $I_{ON}$, and the source and drain of the transistor $M_{CB}$ are connected together to the output end of the current signal $I_{OP}$; the gate of the transistor $M_{CA}$ receives the voltage signal $V_+$, and the gate of the transistor $M_{CB}$ receives the voltage signal $V_-$.

The present invention also provides an integrated circuit, which is encapsulated by a laser driver with high-speed and high-current; the laser driver includes:

an input stage circuit which receives a pair of fully differential input voltage signals, $V_{IP}$, $V_{IN}$, then, adjusting the common-mode output voltage of signals $V_{1IP}$, $V_{1IN}$, such that they could be applied to the subsequent stage;

a pre-drive circuit, for amplifying the voltage signals $V_{1IP}$, $V_{1IN}$ to a pair of voltage signals $V_+$, $V_-$;

a fully differential negative capacitance circuit that is directly connected to the output terminals of the pre-drive circuit, $V_+$, $V_-$; the negative capacitance circuit generates a negative capacitor to reduce the input capacitance of the output stage circuit;

an output stage circuit, for receiving the voltage signals $V_+$, $V_-$, then outputting a pair of modulated current signals $I_{OP}$, $I_{ON}$; and an active reverse termination circuit, for absorbing the reflected wave caused by the output mismatch of the output stage circuit; wherein the active reverse termination circuit comprises:

a pair of transistors $M_{5A}$, $M_{5B}$; the gate of the transistor $M_{5A}$ receives the voltage signal $V_+$, the gate of the transistors $M_{5B}$ receives the voltage signal $V_-$; the sources of the transistors $M_{5A}$, $M_{5B}$ are electrically connected to a tail current source $I_{M1}/k$;

a pair of transistors $M_{6A}$, $M_{6B}$; the gate of the transistor $M_{6A}$ receives the voltage signal $V_+$, the gate of the transistors $M_{6B}$ receives the voltage signal $V_-$; the sources of the transistors $M_{6A}$, $M_{6B}$ are electrically connected to a tail current source $I_{M2}/k$;

a pair of transistors $M_{7A}$, $M_{7B}$; the gate of the transistor $M_{7A}$ receives the voltage signal $V_+$, the gate of the transistors $M_{7B}$ receives the voltage signal $V_-$; the sources of the transistors $M_{7A}$, $M_{7B}$ are electrically connected to a tail current source $I_{M3}/k$;

a pair of transistors $M_{S1}$, $M_{S2}$; the drains of the transistors $M_{5A}$, $M_{6A}$, $M_{7A}$ are electrically connected to the gate of the transistor $M_{S2}$, the drains of the transistors $M_{5B}$, $M_{6B}$, $M_{7B}$ are electrically connected to the gate of the transistor $M_{S1}$; the source of the transistor $M_{S1}$ is electrically connected to a tail current source $I_{B1}$, the source of the transistor $M_{S2}$ is electrically connected to a tail current source $I_{B2}$;

a pair of resistors $R_{3A}$, $R_{3B}$; one end of these resistors is connected with the drains of the transistors $M_{S1}$, $M_{S2}$ to a supply voltage $V_{DD}$; the other ends of the resistors $R_{3A}$ and $R_{3b}$ are connected to the gates of the $M_{S2}$ and $M_{S1}$ respectively; and a pair of capacitors $C_1$, $C_2$; one end of the capacitor $C_1$ is electrically connected to the source of the transistor $M_{S2}$, the other end of capacitor $C_1$ is directly connected to the output current terminal $I_{OP}$; one end of the capacitor $C_2$ is electrically connected to the source of the transistor $M_{S1}$, the other end of capacitor $C_2$ is directly connected to the output terminal $I_{ON}$.

In the integrated circuit of the present invention, the output stage circuit is a three parallel connected output stages circuit; the first output stage is directly connected to the output of the pre-drive circuit while the second and the third output stages are connected to the output of pre-drive using switching circuits; the pins of the integrated circuit include:

a pair of input pins, for transmitting the voltage signals $V_{IP}$, $V_{IN}$ to the input stage circuit;

a pair of output pins, which represent the output modulation current to the laser diode;

a plurality of tail current source pins, for accessing the tail current sources required by the driving circuit of the laser driver;

a plurality of voltage source pins, for accessing the voltage sources required by the driving circuit of the laser driver; and two control signals pins, are used to activate the switching circuits designated for the second and the third output driver stages.

A solution of the present invention, for solving the above problem, is that the voltage signals $V_{1IP}$, $V_{1IN}$ are matched and adjusted by the input stage circuit, and then amplified by the pre-drive circuit to the output stage circuits. Finally, the output modulated current signals $I_{OP}$, $I_{ON}$ are generated. The negative capacitance circuit is used for reducing the input capacitance of the output stage circuits. The active reverse termination circuit absorbs the reflected wave caused by the output mismatch. There is no terminal resistance in the output stage circuit, so the power consumption of the circuit is much lower than that of the traditional circuit.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for the purpose of illustration and description only. It is not intended to be exhaustive or to be limited to the precise disclosed form.

First Embodiment

Figure 1:
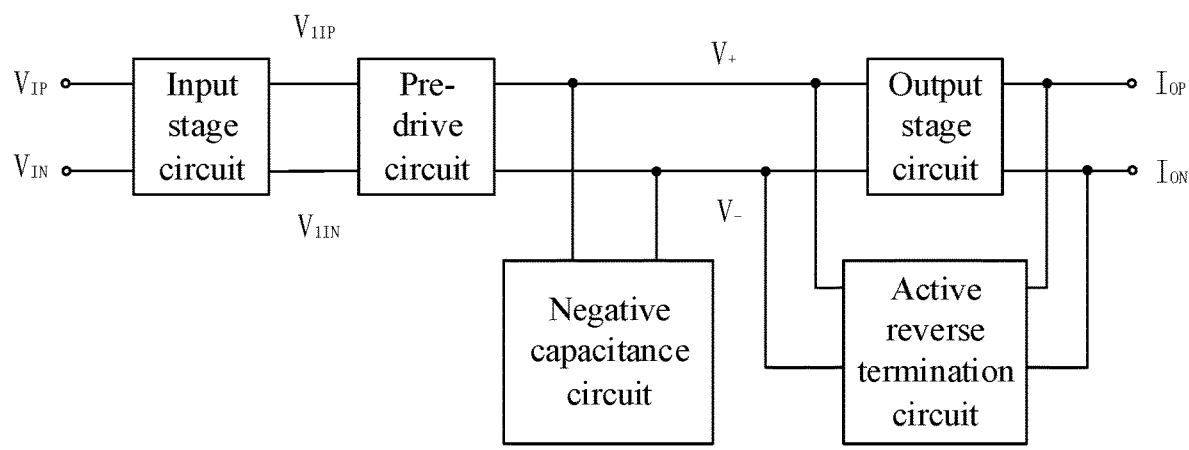
FIG. 1 is a module diagram of the laser driver with high-speed and high-current when the number of the output stage circuit is only one, according to the embodiment of the present invention.

Referring to FIG. 1, a laser driver with high-speed and high-current is shown. The laser driver with high-speed and high-current of the present invention includes an input stage circuit, a pre-drive circuit, a fully differential negative capacitance circuit, an output stage circuit and an active reverse termination circuit. The pre-drive circuit is electrically connected to the out put ends of the input stage circuit. The negative capacitance circuit is electrically connected to the output ends of the pre-drive circuit. The output stage circuit is electrically connected to the out put ends of the pre-drive circuit. The input ends of the active reverse termination circuit are electrically connected to the input ends of the output stage circuit, and the output ends of the active reverse termination circuit are electrically connected to the output ends of the output stage circuit.

A pair of voltage signals $V_{IP}$, $V_{IN}$ are applied to the input stage circuit which amplifies these input signals to a pair of output voltage signals $V_{1IP}$, $V_{1IN}$. Then the voltage signals $V_{1IP}$, $V_{1IN}$ are amplified by the pre-drive circuit to a pair of voltage signals $V_+$, $V_-$ to the output stage circuit, and finally, a pair of modulated current signals $I_{OP}$, $I_{ON}$ are generated by the output stage circuit. In addition, the negative capacitance circuit generates a negative capacitor to reduce the input capacitance of the output stage circuit.

Figure 2:
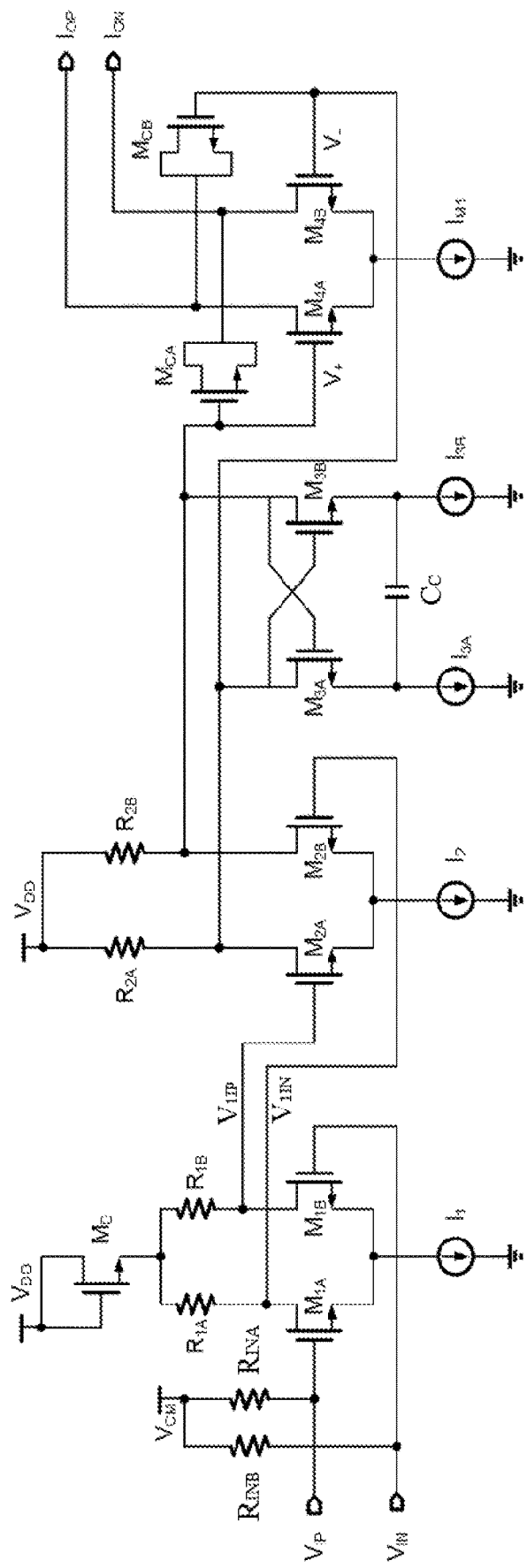
FIG. 2 is a circuit diagram of the laser driver with high-speed and high-current when the number of the output stage circuit is only one, and the active reverse termination circuit is not shown, according to the embodiment of the present invention.

Referring to FIG. 2, the input stage circuit is used for inputting the voltage signals $V_{IP}$, $V_{IN}$, then matching and adjusting the voltage signals $V_{IP}$, $V_{IN}$ into a pair of voltage signals $V_{1IP}$, $V_{1IN}$. The input stage circuit includes a transistor $M_D$, a pair of transistors $M_{1A}$, $M_{1B}$, and a plurality of resistors $R_{INA}$, $R_{INB}$, $R_{1A}$, $R_{1B}$. The gate and drain of the transistor $M_D$ is connected to the voltage source $V_{DD}$. The gates of the transistors $M_{1A}$, $M_{1B}$ respectively are used as the input ends of the input stage circuit, the drains of transistors $M_{1A}$, $M_{1B}$ are electrically connected to input ends of the pre-drive circuit. The gates of the transistors $M_{1A}$, $M_{1B}$ receive the voltage signals $V_{IP}$, $V_{IN}$, respectively, the output voltage signals $V_{1IP}$ and $V_{1IN}$ are taken at the drains of the transistors $M_{1A}$, $M_{1B}$, respectively. The sources of these transistors are connected to a tail current source $I_1$.

One end of the resistor $R_{INA}$ is connected to a voltage source $V_{CM}$, the other end of the resistor $R_{INA}$ is connected to the gate of the transistor $M_{1A}$, one end of the resistor $R_{INB}$ is connected to the voltage source $V_{CM}$, the other end of the resistor $R_{INB}$ is connected to the gate of the transistor $M_{1B}$; one end of the resistor $R_{1A}$ is connected to the drain of the transistors $M_{1A}$, the other end of the resistor $R_{1A}$ is connected to the source of the transistor $M_D$; one end of the resistor $R_{1B}$ is connected to the drain of the transistors $M_{1B}$, the other end of the resistor $R_{1B}$ is connected to the source of the transistor $M_D$.

In this embodiment, both of the resistors, $R_{INA}$ and $R_{INB}$, are 50 ohms. The diode-connected transistor $M_D$ is used to adjust the common-mode output voltage to be suitable for the subsequent stage. The pre-drive circuit is used for amplifying the voltage signals $V_{1IP}$, $V_{1IN}$ to output the voltage signals $V_+$, $V_-$.

The pre-drive circuit includes a pair of transistors $M_{2A}$, $M_{2B}$ and a pair of resistors $R_{2A}$, $R_{2B}$. The gates of the transistors $M_{2A}$, $M_{2B}$ receive the voltage signals $V_{1IP}$, $V_{1IN}$, respectively, the drains of the transistors $M_{2A}$, $M_{2B}$ represent the output voltage signals $V_+$, $V_-$, respectively. The sources of the transistors $M_{2A}$, $M_{2B}$ are connected together to a tail current source $I_2$. One end of the resistors $R_{2A}$ is connected to the drain of the transistors $M_{2A}$, one end of the resistors $R_{2B}$ is connected to the drain of the transistors $M_{2B}$, the other ends of the resistors $R_{2A}$, $R_{2B}$ are connected to the voltage source $V_{DD}$. The diode-connected transistor $M_D$ is used to adjust the output common-mode voltage of the input stage circuit, such that the transistors $M_{2A}$, $M_{2B}$ operate in the saturation region during switching.

Both ends of the negative capacitance circuit are connected to the two output terminals of the pre-drive circuit $V_+$, $V_-$. The negative capacitance circuit includes a pair of transistors $M_{3A}$, $M_{3B}$ and a capacitor $C_c$. The gates of the transistors $M_{3A}$, $M_{3B}$ receive the voltage signals $V_+$, $V_-$ respectively, the drains of transistors $M_{3A}$ and $M_{3B}$ are connected to the voltage signals $V_-$, $V_+$, respectively, and the sources of the transistors $M_{3A}$, $M_{3B}$ are connected to a pair of tail current sources $I_{3A}$, $I_{3B}$. The gate of the transistors $M_{3A}$ and the drain of the transistors $M_{3B}$ are electrically connected together to the positive output end of the pre-drive circuit, the gate of the transistors $M_{3B}$ and the drain of the transistors $M_{3A}$ are electrically connected together to the negative output end of the pre-drive circuit. Two ends of the capacitor $C_c$ are connected to the tail current sources $I_{3A}$, $I_{3B}$. The cross-coupled transistors $M_{3A}$, $M_{3B}$ and the capacitor $C_c$ can generate a negative capacitance at the output end of the pre-drive circuit, which can reduce the capacitance at the interface between the pre-driver and output driver, increasing the circuit bandwidth and speed.

The output stage circuit is used for receiving the voltage signals $V_+$, $V_-$, then outputting the modulated current signals $I_{OP}$, $I_{ON}$. The negative capacitance circuit generates a negative capacitor to reduce the input capacitance of the output stage circuit. The output stage circuit includes a pair of transistors $M_{4A}$, $M_{4B}$, and a pair of transistors $M_{CA}$, $M_{CB}$. The sources of the transistors $M_{4A}$, $M_{4B}$ are connected together to a tail current source $I_{M1}$, the drains of the transistors $M_{4A}$, $M_{4B}$ are connected to the output ends of the current signals $I_{OP}$, $I_{ON}$, respectively. The gate of the transistor $M_{4A}$ receives the voltage signal $V_+$, and the gate of the transistor $M_{4B}$ receives the voltage signal $V_-$. The source and drain of the transistor $M_{CA}$ are connected together to the output end of the current signal $I_{ON}$, and the source and drain of the transistor $M_{CB}$ are connected together to the output end of the current signal $I_{OP}$. The gate of the transistor $M_{CA}$ receives the voltage signal $V_+$, and the gate of the transistor $M_{CB}$ receives the voltage signal $V_-$. The transistors $M_{CA}$, $M_{CB}$ can form an NMOS capacitor, reducing the Miller effect of transistors $M_{4A}$, $M_{4B}$.

Figure 3:
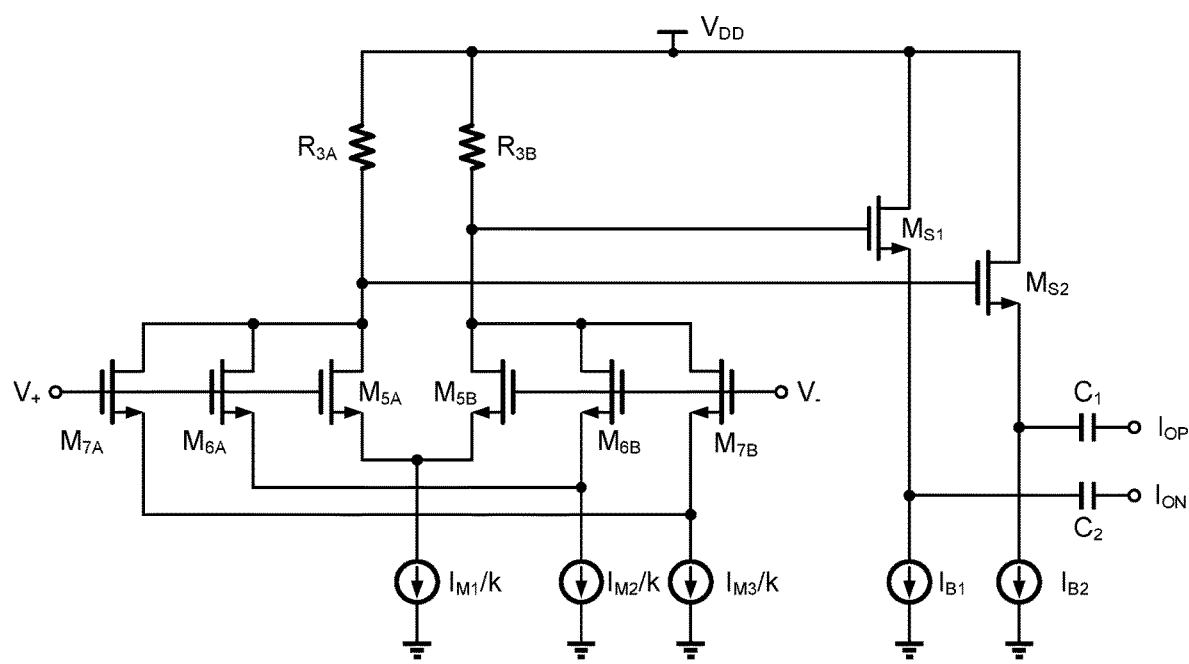
FIG. 3 is a circuit diagram of the active reverse termination circuit of the laser driver, according to the embodiment of the present invention.
Figure 4:
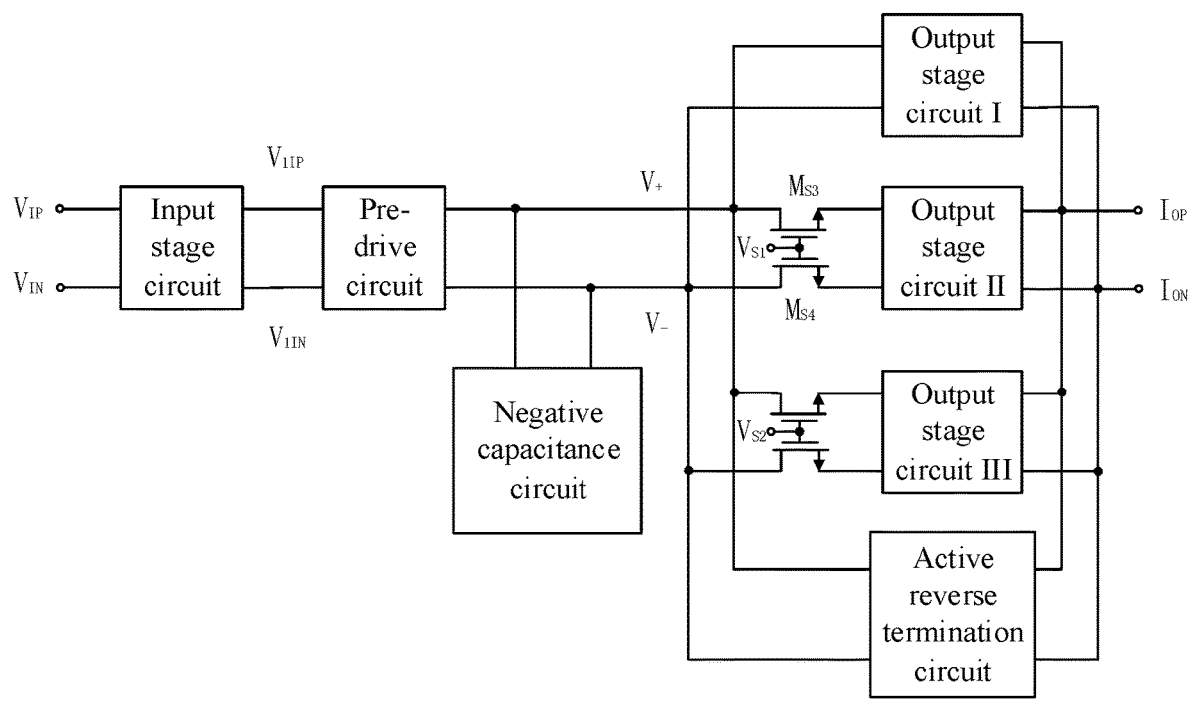
FIG. 4 is a module diagram of the laser driver with high-speed and high-current when the output stage circuit is a three parallel connected output stages circuit, according to the embodiment of the present invention.

Referring to FIG. 3, the active reverse termination circuit includes a pair of transistors $M_{5A}$, $M_{5B}$, a pair of transistors $M_{6A}$, $M_{6B}$, a pair of transistors $M_{7A}$, $M_{7B}$, a pair of transistors $M_{S1}$, $M_{S2}$, a pair of resistors $R_{3A}$, $R_{3B}$, and a pair of capacitors $C_1$, $C_2$. The gate of the transistor $M_{5A}$ is electrically connected to the positive output end of the pre-drive circuit, the gate of the transistor $M_{5B}$ is electrically connected to the negative output end of the pre-drive circuit. In this embodiment, the gate of the transistor $M_{5A}$ receives the voltage signal $V_+$, the gate of the transistors $M_{5B}$ receives the voltage signal $V_-$. The sources of the transistors $M_{5A}$, $M_{5B}$ are connected to a tail current source $I_{M1}/k$. The gate of the transistor $M_{6A}$ is electrically connected to the positive output end of the pre-drive circuit, the gate of the transistor $M_{6B}$ is electrically connected to the negative output end of the pre-drive circuit. The gate of the transistor $M_{6A}$ receives the voltage signal $V_+$, the gate of the transistors $M_{6B}$ receives the voltage signal $V_-$. The sources of the transistors $M_{6A}$, $M_{6B}$ are connected to a tail current source $I_{M2}/k$. The gate of the transistor $M_{7A}$ is electrically connected to the positive output end of the pre-drive circuit, the gate of the transistor $M_{7B}$ is electrically connected to the negative output end of the pre-drive circuit. The gate of the transistor $M_{7A}$ receives the voltage signal $V_+$, the gate of the transistors $M_{7B}$ receives the voltage signal $V_-$. The sources of the transistors $M_{7A}$, $M_{7B}$ are connected to a tail current source $I_{M3}/k$.

The drains of the transistors $M_{5A}$, $M_{6A}$, $M_{7A}$ are connected to the gate of the transistor $M_{S2}$, the drains of the transistors $M_{5B}$, $M_{6B}$, $M_{7B}$ are connected to the gate of the transistor $M_{S1}$. The source of the transistor $M_{S1}$ is connected to a tail current source $I_{B1}$, the source of the transistor $M_{S2}$ is connected to a tail current source $I_{B2}$. One end of the resistors $R_{3A}$, $R_{3B}$ is connected with the drains of the transistors $M_{S1}$, $M_{S2}$ to a supply voltage $V_{DD}$. The other ends of the resistors $R_{3A}$ and $R_{3b}$ are connected to the gates of the $M_{S2}$ and $M_{S1}$, respectively. One end of the capacitor $C_1$ is electrically connected to the source of the transistor $M_{S2}$, the other end of capacitor $C_1$ is directly connected to the output current terminal $I_{OP}$; one end of the capacitor $C_2$ is electrically connected to the source of the transistor $M_{S1}$, the other end of capacitor $C_2$ is directly connected to the output terminal $I_{ON}$.

In this embodiment, the transistors $M_{S1}$, $M_{S2}$ form source follower stages with low output impedance, about 20Ω, which helps to absorb reflected waves from the laser side. The active reverse back termination circuit is AC coupled to the output terminals of the driver circuit using $C_1$ and $C_2$. The AC coupling technique isolates the DC voltage of the active reverse circuit and the driver circuit. Therefore, the active reverse termination circuit will not sink or source any excess DC current from or to the output driver. There is no need to use an additional dc offset cancellation circuit to save power and area. Meanwhile, the output stage circuit does not need to use terminal resistors to absorb reflected waves, thus greatly reducing power consumption.

As described above, the voltage signals $V_{1IP}$, $V_{1IN}$ are matched and adjusted by the input stage circuit, and then amplified by the pre-drive circuit to the output stage circuits. Finally, the output modulated current signals $I_{OP}$, $I_{ON}$ are generated. The negative capacitance circuit is used for reducing the input capacitance of the output stage circuit. The active reverse termination circuit absorbs the reflected wave caused by the output mismatch. There is no terminal resistance in the output stage circuit, so the power consumption of the circuit is much lower than that of the traditional circuit.

Second Embodiment

Referring to FIG. 1, a laser driver with high-speed and high-current is shown. The laser driver with high-speed and high-current of the present invention includes an input stage circuit, a pre-drive circuit, a negative capacitance circuit, a three parallel-connected output stages circuit and an active reverse termination circuit. A pair of voltage signals $V_{IP}$, $V_{IN}$ are applied to the input stage circuit which amplifies these input signals to a pair of output voltage signals $V_{1IP}$, $V_{1IN}$. Then the voltage signals $V_{1IP}$, $V_{1IN}$ are amplified by the pre-drive circuit to a pair of voltage signals $V_+$, $V_-$ to the output stage circuit, and finally, a pair of modulated current signals $I_{OP}$, $I_{ON}$ are generated by the output stage circuit. In addition, the negative capacitance circuit generates a negative capacitor to reduce the input capacitance of the output stage circuit.

Referring to FIG. 2 again, the input stage circuit is used for inputting the voltage signals $V_{IP}$, $V_{IN}$, then matching and adjusting the voltage signals $V_{IP}$, $V_{IN}$ into a pair of voltage signals $V_{1IP}$, $V_{1IN}$. The input stage circuit includes a transistor $M_D$, a pair of transistors $M_{1A}$, $M_{1B}$, and a plurality of resistors $R_{INA}$, $R_{INB}$, $R_{1A}$, $R_{1B}$. The gate and drain of the transistor $M_D$ is connected to the voltage source $V_{DD}$. The gates of the transistors $M_{1A}$, $M_{1B}$ receive the voltage signals $V_{IP}$, $V_{IN}$, respectively, the output voltage signals $V_{1IP}$ and $V_{1IN}$ are taken at the drains of the transistors $M_{1A}$, $M_{1B}$, respectively. The sources of these transistors are connected to a tail current source $I_1$. One end of the resistor $R_{INA}$ is connected to a voltage source $V_{CM}$, the other end of the resistor $R_{INA}$ is connected to the gate of the transistor $M_{1A}$; one end of the resistor $R_{INB}$ is connected to the voltage source $V_{CM}$, the other end of the resistor $R_{INB}$ is connected to the gate of the transistor $M_{1B}$; one end of the resistor $R_{1A}$ is connected to the drain of the transistors $M_{1A}$, the other end of the resistor $R_{1A}$ is connected to the source of the transistor $M_D$; one end of the resistor $R_{1B}$ is connected to the drain of the transistors $M_{1B}$, the other end of the resistor $R_{1B}$ is connected to the source of the transistor $M_D$.

In this embodiment, both of the resistors, $R_{INA}$ and $R_{INB}$, are 50 ohms. The diode-connected transistor $M_D$ is used to adjust the common-mode output voltage to be suitable for the subsequent stage. The pre-drive circuit is used for amplifying the voltage signals $V_{1IP}$, $V_{1IN}$ to output the voltage signals $V_+$, $V_-$. The pre-drive circuit includes a pair of transistors $M_{2A}$, $M_{2B}$ and a pair of resistors $R_{2A}$, $R_{2B}$. The gates of the transistors $M_{2A}$, $M_{2B}$ receive the voltage signals $V_{1IP}$, $V_{1IN}$, respectively, the drains of the transistors $M_{2A}$, $M_{2B}$ represent the output voltage signals $V_+$, $V_-$, respectively. The sources of the transistors $M_{2A}$, $M_{2B}$ are connected together to a tail current source $I_2$. One end of the resistors $R_{2A}$ is connected to the drain of the transistors $M_{2A}$, one end of the resistors $R_{2B}$ is connected to the drain of the transistors $M_{2B}$, the other ends of the resistors $R_{2A}$, $R_{2B}$ are connected to the voltage source $V_{DD}$. The diode-connected transistor $M_D$ is used to adjust the output common-mode voltage of the input stage circuit, such that the transistors $M_{2A}$, $M_{2B}$ operate in the saturation region during switching. Both ends of the negative capacitance circuit are connected to the two output terminals of the pre-drive circuit $V_+$, $V_-$. The negative capacitance circuit includes a pair of transistors $M_{3A}$, $M_{3B}$ and a capacitor $C_c$. The gates of the transistors $M_{3A}$, $M_{3B}$ receive the voltage signals $V_+$, $V_-$, respectively, the drains of $M_{3A}$ and $M_{3B}$ are connected to the voltage signals $V_-$, $V_+$, respectively, and the sources of the transistors $M_{3A}$, $M_{3B}$ are connected to a pair of tail current sources $I_{3A}$, $I_{3B}$. Two ends of the capacitor $C_c$ are connected to the tail current sources $I_{3A}$, $I_{3B}$. The cross-coupled transistors $M_{3A}$, $M_{3B}$ and the capacitor $C_c$ can generate a negative capacitance at the output end of the pre-drive circuit, which can reduce the capacitance at the interface between the pre-driver and output driver, increasing the circuit bandwidth and speed.

The output stage circuits are used for receiving the voltage signals $V_+$, $V_-$, then outputting the modulated current signals $I_{OP}$, $I_{ON}$. The negative capacitance circuit generates a negative capacitor to reduce the input capacitance of the output stage circuit. The output stage circuit includes a pair of transistors $M_{4A}$, $M_{4B}$, and a pair of transistors $M_{CA}$, $M_{CB}$. The sources of the transistors $M_{4A}$, $M_{4B}$ are connected together to a tail current source $I_{M1}$, the drains of the transistors $M_{4A}$, $M_{4B}$ are connected to the output ends of the current signals $I_{OP}$, $I_{ON}$, respectively. The gate of the transistor $M_{4A}$ receives the voltage signal $V_+$, and the gate of the transistor $M_{4B}$ receives the voltage signal $V_-$. The source and drain of the transistor $M_{CA}$ are connected together to the output end of the current signal $I_{ON}$, and the source and drain of the transistor $M_{CB}$ are connected together to the output end of the current signal $I_{OP}$. The gate of the transistor $M_{CA}$ receives the voltage signal $V_+$, and the gate of the transistor $M_{CB}$ receives the voltage signal $V_-$. The transistors $M_{CA}$, $M_{CB}$ can form an NMOS capacitor, reducing the Miller effect of transistors $M_{4A}$, $M_{4B}$.

In this embodiment, the first output stage is directly connected to the output of the pre-drive circuit while the second and the third output stages are connected to the output of the pre-driver using switching circuits. Each switching circuit includes a pair of transistors $M_{S3}$, $M_{S4}$; the gates of the transistors $M_{S3}$, $M_{S4}$ receive a control signal $V_s$, the sources of the transistors $M_{S3}$, $M_{S4}$ are connected to the inputs of the second output stage, the drains of the transistors $M_{S3}$, $M_{S4}$ receive the voltage signals $V_+$, $V_-$, respectively.

In addition, the number of the output stage circuits is three, and the number of the switching circuits is two. The internal structures of these output stage circuits are the same, and the internal structures of the two switching circuits are the same. One of the witching circuits is controlled by a control signal $V_{s1}$, and the other switching circuit is controlled by a control signal $V_{s2}$. When the control signals $V_{s1}$, $V_{s2}$ are 0, the output modulation current can be adjusted from 10 mA to 50 mA; when the switch control signal $V_{s1}$ is 1 and the switch control signal $V_{s2}$ is 0, the output modulation current can reach 100 mA; when the switch control signals $V_{s1}$, $V_{s2}$ are 1, the output modulation current is as high as 150 mA.

Referring to FIG. 3 again, the active reverse termination circuit includes a pair of transistors $M_{5A}$, $M_{5B}$, a pair of transistors $M_{6A}$, $M_{6B}$, a pair of transistors $M_{7A}$, $M_{7B}$, a pair of transistors $M_{S1}$, $M_{S2}$, a pair of resistors $R_{3A}$, $R_{3B}$ and a pair of capacitors $C_1$, $C_2$. The gate of the transistor $M_{5A}$ receives the voltage signal $V_+$, the gate of the transistors $M_{5B}$ receives the voltage signal $V_-$. The sources of the transistors $M_{5A}$, $M_{5B}$ are connected to a tail current source $I_{M1}/k$. The gate of the transistor $M_{6A}$ receives the voltage signal $V_+$, the gate of the transistors $M_{6B}$ receives the voltage signal $V_-$. The sources of the transistors $M_{6A}$, $M_{6B}$ are connected to a tail current source $I_{M2}/k$. The gate of the transistor $M_{7A}$ receives the voltage signal $V_+$, the gate of the transistors $M_{7B}$ receives the voltage signal $V_-$. The sources of the transistors $M_{7A}$, $M_{7B}$ are connected to a tail current source $I_{M3}/k$.

The drains of the transistors $M_{5A}$, $M_{6A}$, $M_{7A}$ are connected to the gate of the transistor $M_{S2}$, the drains of the transistors $M_{5B}$, $M_{6B}$, $M_{7B}$ are connected to the gate of the transistor $M_{S1}$. The source of the transistor $M_{S1}$ is connected to a tail current source $I_{B1}$, the source of the transistor $M_{S2}$ is connected to a tail current source $I_{B2}$. One end of the resistors $R_{3A}$, $R_{3B}$ is connected with the drains of the transistors $M_{S1}$, $M_{S2}$ to a supply voltage $V_{DD}$. The other ends of the resistors $R_{3A}$ and $R_{3b}$ are connected to the gates of the $M_{S2}$ and $M_{S1}$, respectively. One end of the capacitor $C_1$ is electrically connected to the source of the transistor $M_{S2}$, the other end of capacitor $C_1$ is directly connected to the output current terminal $I_{OP}$; one end of the capacitor $C_2$ is electrically connected to the source of the transistor $M_{S1}$, the other end of capacitor $C_2$ is directly connected to the output terminal $I_{ON}$. The active reverse termination circuit absorbs reflection waves due to output mismatch through the capacitors $C_1$, $C_2$.

In this embodiment, the transistors $M_{S1}$, $M_{S2}$ form source follower stages with low output impedance, about 20Ω, which helps to absorb reflected waves from the laser side. The active reverse back termination circuit is AC coupled to the output terminals of the driver circuit using $C_1$ and $C_2$. The AC coupling technique isolates the DC voltage of the active reverse circuit and the driver circuit. Therefore, the active reverse termination circuit will not sink or source any excess DC current from or to the output driver. There is no need to use an additional dc offset cancellation circuit which helps to save power and area. Meanwhile, the output stage circuit does not need to use terminal resistors to absorb reflected waves, thus greatly reducing power consumption.

As described above, the voltage signals $V_{1IP}$, $V_{1IN}$ matched and adjusted by the input stage circuit, and then amplified by the pre-drive circuit to the output stage circuits. Finally, the output modulated current signals $I_{OP}$, $I_{ON}$ are generated. The negative capacitance circuit is used for reducing the input capacitance of the output stage circuits. The active reverse termination circuit absorbs the reflected wave caused by the output mismatch. There is no terminal resistance in the output stage circuit, so the power consumption of the circuit is much lower than that of the traditional circuit.

Third Embodiment

An integrated circuit is shown as an embodiment, and the integrated circuit is encapsulated by a laser driver with high-speed and high-current. The pins of the integrated circuit include a pair of input pins, a pair of output pins, a plurality of tail current source pins and a plurality of voltage source pins.

The input pins are used for transmitting the voltage signals $V_{IP}$, $V_{IN}$ to the input stage circuit. The output pins represent the output modulation current to the laser diode $I_{OP}$, $I_{ON}$. The tail current source pins are used for accessing the tail current sources required by the driving circuit. The tail current sources include the sources $I_1$, $I_2$, $I_{3A}$, $I_{3B}$, $I_{M1}/k$, $I_{M2}/k$, $I_{M3}/k$, $I_{B1}$, $I_{B2}$ and three $I_{M1}$. The voltage source pins are used for accessing the voltage sources (such as $V_{DD}$ and $V_{CM}$) required by the driving circuit.

Fourth Embodiment

An integrated circuit is shown as an embodiment, and the integrated circuit is encapsulated by a laser driver with high-speed and high-current. The pins of the integrated circuit include a pair of input pins, a pair of output pins, a plurality of tail current source pins, a plurality of voltage source pins, and at least one control signal pin.

The input pins are used for transmitting the voltage signals $V_{IP}$, $V_{IN}$ to the input stage circuit. The output pins represent the output modulation current to the laser diode $I_{OP}$, $I_{ON}$. The tail current source pins are used for accessing the tail current sources required by the driving circuit. The tail current sources include the sources $I_1$, $I_2$, $I_{3A}$, $I_{3B}$, $I_{M1}/k$, $I_{M2}/k$, $I_{M3}/k$, $I_{B1}$, $I_{B2}$ and three $I_{M1}$. The voltage source pins are used for accessing the voltage sources (such as $V_{DD}$ and $V_{CM}$) required by the driving circuit. While the invention has been described in terms of what is presently considered to be the most practical and preferred embodiments, it is to be understood that the invention needs not to be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A laser driver with high-speed and high-current, comprising:
   an input stage circuit;
   a pre-drive circuit, being electrically connected to output ends of the input stage circuit;
   a fully differential negative capacitance circuit, being electrically connected to output ends of the pre-drive circuit;
   a output stage circuit being electrically connected to the output ends of the pre-drive circuit; and
   an active reverse termination circuit; input ends of the active reverse termination circuit being electrically connected to input ends of the output stage circuit, and output ends of the active reverse termination circuit being electrically connected to output ends of the output stage circuit.

2. The laser driver according to claim 1, wherein the active reverse termination circuit comprises:
   a pair of transistors $M_{5A}$, $M_{5B}$; wherein a gate of the transistor $M_{5A}$ is electrically connected to a positive output end of the pre-drive circuit, a gate of the transistor $M_{5B}$ is electrically connected to a negative output end of the pre-drive circuit; sources of the transistors $M_{5A}$, $M_{5B}$ are electrically connected to a tail current source $I_{M1}/K$;
   a pair of transistors $M_{6A}$, $M_{6B}$; wherein a gate of the transistor $M_{6A}$ is electrically connected to the positive output end of the pre-drive circuit, a gate of the transistor $M_{6B}$ is electrically connected to the negative output end of the pre-drive circuit; sources of the transistors $M_{6A}$, $M_{6B}$ are electrically connected to a tail current source $I_{M2}/k$;
   a pair of transistors $M_{7A}$, $M_{7B}$; wherein a gate of the transistor $M_{7A}$ is electrically connected to the positive output end of the pre-drive circuit, a gate of the transistor $M_{7B}$ is electrically connected to the negative output end of the pre-drive circuit; sources of the transistors $M_{7A}$, $M_{7B}$ are electrically connected to a tail current source $I_{M3}/k$;
   a pair of transistors $M_{S1}$, $M_{S2}$; wherein drains of the transistors $M_{5A}$, $M_{6A}$, $M_{7A}$ are electrically connected to a gate of the transistor $M_{S2}$, drains of the transistors $M_{5B}$, $M_{6B}$, $M_{7B}$ are electrically connected to a gate of the transistor $M_{S1}$; a source of the transistor $M_{S1}$ is electrically connected to a tail current source $I_{B1}$ a source of the transistor $M_{S2}$ is electrically connected to a tail current source $I_{B2}$;
   a pair of resistors $R_{3A}$, $R_{3B}$; wherein one end of these resistors is connected with drains of the transistors $M_{S1}$, $M_{S2}$ to a supply voltage $V_{DD}$; the other ends of the resistors $R_{3A}$ and $R_{3b}$ are connected to the gates of the $M_{S2}$ and $M_{S1}$, respectively; and
   a pair of capacitors $C_1$, $C_2$; wherein one end of the capacitor $C_1$ is electrically connected to the source of the transistor $M_{S2}$, the other end of capacitor $C_1$ is directly connected to an output current terminal $I_{OP}$; one end of the capacitor $C_2$ is electrically connected to the source of the transistor $M_{S1}$, the other end of capacitor $C_2$ is directly connected to an output terminal $I_{ON}$.

3. The laser driver according to claim 2, wherein the input stage circuit comprises:
   a transistor $M_D$; wherein a gate and a drain of the transistor $M_D$ are electrically connected to a voltage source $V_{DD}$;
   a pair of transistors $M_{1A}$, $M_{1B}$; wherein gates of the transistors $M_{1A}$, $M_{1B}$ respectively are used as input ends of the input stage circuit, drains of transistors $M_{1A}$, $M_{1B}$ are electrically connected to input ends of the pre-drive circuit, sources of the $M_{1A}$ and $M_{1B}$ are connected to a tail current source $I_1$; and
   a plurality of resistors $R_{INA}$, $R_{INB}$, $R_{1A}$, and $R_{1B}$; wherein one end of the resistor $R_{INA}$ is electrically connected to a voltage source $V_{CM}$, the other end of the resistor $R_{INA}$ is electrically connected to the gate of the transistor $M_{1A}$; one end of the resistor $R_{INB}$ is electrically connected to the voltage source $V_{CM}$, the other end of the resistor $R_{INB}$ is electrically connected to the gate of the transistor $M_{1B}$; one end of the resistor $R_{1A}$ is electrically connected to the drain of the transistors $M_{1A}$, the other end of the resistor $R_{1A}$ is electrically connected to the source of the transistor $M_D$; one end of the resistor $R_{1B}$ is electrically connected to the drain of the transistors $M_{1B}$, the other end of the resistor $R_{1B}$ is electrically connected to a source of the transistor $M_D$.

4. The laser driver according to claim 3, wherein both resistors $R_{INA}$ and $R_{INB}$ are 50 ohms.

5. The laser driver according to claim 3, wherein the pre-drive circuit comprises:
   a pair of transistors $M_{2A}$, $M_{2B}$; wherein gates of the transistors $M_{2A}$, $M_{2B}$ are electrically connected to the drains of transistors $M_{1A}$, $M_{1B}$ respectively, drains of the transistors $M_{2A}$, $M_{2B}$ are electrically connected to input ends of the output stage circuit, sources of the transistors $M_{2A}$, $M_{2B}$ are connected to a tail current source $I_2$; and
   a pair of resistors $R_{2A}$, $R_{2B}$; wherein one end of the resistors $R_{2A}$ is connected to the drain of the transistors $M_{2A}$, one end of the resistors $R_{2B}$ is connected to the drain of the transistors $M_{2B}$, the other ends of the resistors $R_{2A}$, $R_{2B}$ are connected to the voltage source $V_{DD}$.

6. The laser driver according to claim 5, wherein the fully differential negative capacitance circuit comprises:
   a pair of transistors $M_{3A}$, $M_{3B}$; wherein a gate of the transistors $M_{3A}$ and a drain of the transistors $M_{3B}$ are electrically connected together to the positive output end of the pre-drive circuit, a gate of the transistors $M_{3B}$ and a drain of the transistors $M_{3A}$ are electrically connected together to the negative output end of the pre-drive circuit, sources of the transistors $M_{3A}$, $M_{3B}$ are connected to a pair of tail current sources $I_{3A}$, $I_{3B}$ respectively; and
   a capacitor $C_c$; wherein two ends of the capacitor $C_c$ are connected to the tail current sources $I_{3A}$, $I_{3B}$.

7. The laser driver according to claim 6, wherein the output stage circuit comprises:
   a pair of transistors $M_{4A}$, $M_{4B}$; wherein sources of the transistors $M_{4A}$, $M_{4B}$ are electrically connected together to a tail current source $I_{M1}$, drains of the transistors $M_{4A}$, $M_{4B}$ represent output ends of the output current terminals $I_{OP}$, $I_{ON}$; a gate of the transistor $M_{4A}$ is electrically connected to the positive output end of the pre-drive circuit, and a gate of the transistor $M_{4B}$ is electrically connected to the negative output end of the pre-drive circuit; and
   a pair of transistors $M_{CA}$, $M_{CB}$; wherein a source and a drain of the transistor $M_{CA}$ are connected together to the output end of the output current terminal $I_{ON}$, and a source and a drain of the transistor $M_{CB}$ are connected together to the output end of the output current terminal $I_{OP}$; a gate of the transistor $M_{CA}$ is electrically connected to the positive output end of the pre-drive circuit, and a gate of the transistor $M_{CB}$ is electrically connected to the negative output end of the pre-drive circuit.

8. The laser driver according to claim 1, wherein the output stage circuit is a three parallel connected output stages circuit.

9. The laser driver according to claim 8, wherein a first output stage is directly connected to the output of the pre-drive circuit while a second and a third output stages are connected to the output of pre-drive using switching circuits.

10. The laser driver according to claim 9, wherein each switching circuit comprises:
    a pair of transistors $M_{S3}$, $M_{S4}$; wherein gates of the transistors $M_{S3}$, $M_{S4}$ receive a switch control signal $V_s$, sources of the transistors $M_{S3}$, $M_{S4}$ respectively electrically are connected to the inputs of the second output stage via two input ends of the corresponding switching circuit, drains of the transistors $M_{S3}$, $M_{S4}$ are electrically connected to the output ends of the pre-drive circuit respectively.

11. The laser driver according to claim 9, wherein one of the switching circuits is controlled by a switch control signal $V_{s1}$, and the other of the switching circuits is controlled by a switch control signal $V_{s2}$.

12. The laser driver according to claim 11, wherein when the switch control signals $V_{s1}$, $V_{s2}$ are 0, the output modulation current can be adjusted from 10 mA to 50 mA; when the switch control signal $V_{s1}$ is 1 and the switch control signal $V_{s2}$ is 0, the output modulation current can reach 100 mA; when the switch control signals $V_{s1}$, $V_{s2}$ are 1, the output modulation current is as high as 150 mA.

13. A laser driver with high-speed and high-current, comprising:
    an input stage circuit which receives a pair of fully differential input voltage signals, $V_{IP}$, $V_{IN}$, then, adjusting a common-mode output voltage of signals $V_{1IP}$, $V_{1IN}$, such that they could be applied to a subsequent stage;
    a pre-drive circuit, for amplifying voltage signals $V_{1IP}$, $V_{1IN}$ to a pair of voltage signals $V_+$, $V_-$;
    a fully differential negative capacitance circuit that is directly connected to output terminals of the pre-drive circuit, $V_+$, $V_-$; the fully differential negative capacitance circuit generating a negative capacitor to reduce the input capacitance of the output stage circuit;
    an output stage circuit, for receiving the voltage signals $V_+$, $V_-$, then outputting a pair of modulated current signals $I_{OP}$, $I_{ON}$; and
    an active reverse termination circuit, for absorbing the reflected wave caused by the output mismatch of the output stage circuit.

14. The laser driver according to claim 13, wherein the active reverse termination circuit comprises:
    a pair of transistors $M_{5A}$, $M_{5B}$; wherein a gate of the transistor $M_{5A}$ receives the voltage signal $V_+$, a gate of the transistors $M_{5B}$ receives the voltage signal $V_-$; sources of the transistors $M_{5A}$, $M_{5B}$ are electrically connected to a tail current source $I_{M1}/k$;
    a pair of transistors $M_{6A}$, $M_{6B}$; wherein a gate of the transistor $M_{6A}$ receives the voltage signal $V_+$, a gate of the transistors $M_{6B}$ receives the voltage signal $V_-$; sources of the transistors $M_{6A}$, $M_{6B}$ are electrically connected to a tail current source $I_{M2}/k$;
    a pair of transistors $M_{7A}$, $M_{7B}$; wherein a gate of the transistor $M_{7A}$ receives the voltage signal $V_+$, a gate of the transistors $M_{7B}$ receives the voltage signal $V_-$; sources of the transistors $M_{7A}$, $M_{7B}$ are electrically connected to a tail current source $I_{M3}/k$;
    a pair of transistors $M_{S1}$, $M_{S2}$; wherein drains of the transistors $M_{5A}$, $M_{6A}$, $M_{7A}$ are electrically connected to a gate of the transistor $M_{S2}$, drains of the transistors $M_{5B}$, $M_{6B}$, $M_{7B}$ are electrically connected to a gate of the transistor $M_{S1}$; a source of the transistor $M_{S1}$ is electrically connected to a tail current source $I_{B1}$, a source of the transistor $M_{S2}$ is electrically connected to a tail current source $I_{B2}$;
    a pair of resistors $R_{3A}$, $R_{3B}$; wherein one end of each of these resistors is connected with drains of the transistors $M_{S1}$, $M_{S2}$ to a supply voltage $V_{DD}$; the other end of each of the resistors $R_{3A}$ and $R_{3b}$ are connected to the gates of the $M_{S2}$ and $M_{S1}$ respectively; and
    a pair of capacitors $C_1$, $C_2$; wherein one end of the capacitor $C_1$ is electrically connected to the source of the transistor $M_{S2}$, the other end of capacitor $C_1$ is directly connected to a output current terminal for the modulated current signal $I_{OP}$; one end of the capacitor $C_2$ is electrically connected to the source of the transistor $M_{S1}$, the other end of capacitor $C_2$ is directly connected to a output terminal for the modulated current signal $I_{ON}$.

15. The laser driver according to claim 14, wherein the input stage circuit comprises:
    a transistor $M_D$; wherein a gate and a drain of the transistor $M_D$ are electrically connected to a voltage source $V_{DD}$;
    a pair of transistors $M_{1A}$, $M_{1B}$; wherein gates of the transistors $M_{1A}$, $M_{1B}$, respectively receive the voltage signals $V_{IP}$, $V_{IN}$, the output voltage signals $V_{1IP}$ and $V_{1IN}$ are taken at drains of $M_{1A}$, $M_{1B}$ respectively, sources of the $M_{1A}$ and $M_{1B}$ are connected to a tail current source $I_1$; and a plurality of resistors $R_{INA}$, $R_{INB}$, $R_{1A}$, and $R_{1B}$; wherein one end of the resistor $R_{INA}$ is connected to a voltage source $V_{CM}$, the other end of the resistor $R_{INA}$ is connected to the gate of the transistor $M_{1A}$; one end of the resistor $R_{INB}$ is connected to the voltage source $V_{CM}$, the other end of the resistor $R_{INB}$ is connected to the gate of the transistor $M_{1B}$; one end of the resistor $R_{1A}$ is connected to the drain of the transistors $M_{1A}$, the other end of the resistor $R_{1A}$ is connected to the source of the transistor $M_D$; one end of the resistor $R_{1B}$ is connected to the drain of the transistors $M_{1B}$, the other end of the resistor $R_{1B}$ is connected to a source of the transistor $M_D$.

16. The laser driver according to claim 15, wherein the pre-drive circuit comprises:

a pair of transistors $M_{2A}$, $M_{2B}$; wherein gates of the transistors $M_{2A}$, $M_{2B}$ receive the voltage signals $V_{1IP}$, $V_{1IN}$ respectively, drains of the transistors $M_{2A}$, $M_{2B}$ represent the output voltage signals $V_+$, $V_-$ respectively, sources of the transistors $M_{2A}$, $M_{2B}$ are connected to a tail current source $I_2$; and a pair of resistors $R_{2A}$, $R_{2B}$; one end of the resistors $R_{2A}$ is connected to the drain of the transistors $M_{2A}$, one end of the resistors $R_{2B}$ is connected to the drain of the transistors $M_{2B}$, the other ends of the resistors $R_{2A}$, $R_{2B}$ are electrically connected to the voltage source $V_{DD}$.

17. The laser driver according to claim 16, wherein the negative capacitance circuit comprises:

a pair of transistors $M_{3A}$, $M_{3B}$; wherein gates of the transistors $M_{3A}$, $M_{3B}$ receive the voltage signals $V_+$, $V_-$, drains of $M_{3A}$ and $M_{3B}$ receive the voltage signals $V_-$, $V_+$ respectively, sources of the transistors $M_{3A}$, $M_{3B}$ are electrically connected to a pair of tail current sources $I_{3A}$, $I_{3B}$ respectively; and a capacitor $C_c$; wherein two ends of the capacitor $C_c$ are electrically connected to the tail current sources $I_{3A}$, $I_{3B}$.

18. The laser driver according to claim 17, wherein the output stage circuit comprises:

a pair of transistors $M_{4A}$, $M_{4B}$; wherein sources of the transistors $M_{4A}$, $M_{4B}$ are connected together to a tail current source $I_{M1}$, drains of the transistors $M_{4A}$, $M_{4B}$ represent the output ends of the current signals $I_{OP}$, $I_{ON}$; a gate of the transistor $M_{4A}$ receives the voltage signal $V_+$, and a gate of the transistor $M_{4B}$ receives the voltage signal $V_-$; and a pair of transistors $M_{CA}$, $M_{CB}$; wherein a source and a drain of the transistor $M_{CA}$ are connected together to the output end of the current signal $I_{ON}$, and a source and a drain of the transistor $M_{CB}$ are connected together to the output end of the current signal $I_{OP}$; a gate of the transistor $M_{CA}$ receives the voltage signal $V_+$, and a gate of the transistor $M_{CB}$ receives the voltage signal $V_-$.

19. An integrated circuit, being encapsulated by a laser driver with high-speed and high-current; the laser driver comprising:

an input stage circuit which receives a pair of fully differential input voltage signals $V_{IP}$, $V_{IN}$, then, adjusting a common-mode output voltage of signals $V_{1IP}$, $V_{1IN}$, such that they could be applied to a subsequent stage;

a pre-drive circuit, for amplifying voltage signals $V_{1IP}$, $V_{1IN}$ to a pair of voltage signals $V_+$, $V_-$;

a fully differential negative capacitance circuit that is directly connected to output terminals of the pre-drive circuit, $V_+$, $V_-$; wherein the fully differential negative capacitance circuit generates a negative capacitor to reduce input capacitance of the output stage circuit;

an output stage circuit, for receiving the voltage signals $V_+$, $V_-$, then outputting a pair of modulated current signals $I_{OP}$, $I_{ON}$; and an active reverse termination circuit, for absorbing the reflected wave caused by the output mismatch of the output stage circuit; wherein the active reverse termination circuit comprises:

a pair of transistors $M_{5A}$, $M_{5B}$; wherein a gate of the transistor $M_{5A}$ receives the voltage signal $V_+$, a gate of the transistors $M_{5B}$ receives the voltage signal $V_-$; sources of the transistors $M_{5A}$, $M_{5B}$ are electrically connected to a tail current source $I_{M1}/k$;

a pair of transistors $M_{6A}$, $M_{6B}$; wherein a gate of the transistor $M_{6A}$ receives the voltage signal $V_+$, a gate of the transistors $M_{6B}$ receives the voltage signal $V_-$; sources of the transistors $M_{6A}$, $M_{6B}$ are electrically connected to a tail current source $I_{M2}/k$;

a pair of transistors $M_{7A}$, $M_{7B}$; wherein a gate of the transistor $M_{7A}$ receives the voltage signal $V_+$, a gate of the transistors $M_{7B}$ receives the voltage signal $V_-$; sources of the transistors $M_{7A}$, $M_{7B}$ are electrically connected to a tail current source $I_{M3}/k$;

a pair of transistors $M_{S1}$, $M_{S2}$; wherein drains of the transistors $M_{5A}$, $M_{6A}$, $M_{7A}$ are electrically connected to a gate of the transistor $M_{S2}$, drains of the transistors $M_{5B}$, $M_{6B}$, $M_{7B}$ are electrically connected to a gate of the transistor $M_{S1}$; a source of the transistor $M_{S1}$ is electrically connected to a tail current source $I_{B1}$, a source of the transistor $M_{S2}$ is electrically connected to a tail current source $I_{B2}$;

a pair of resistors $R_{3A}$, $R_{3B}$; wherein one end of each of these resistors is connected with the drains of the transistors $M_{S1}$, $M_{S2}$ to a supply voltage $V_{DD}$; the other ends of the resistors $R_{3A}$ and $R_{3b}$ are connected to the gates of the $M_{S2}$ and $M_{S1}$ respectively; and a pair of capacitors $C_1$, $C_2$; wherein one end of the capacitor $C_1$ is electrically connected to the source of the transistor $M_{S2}$, the other end of capacitor $C_1$ is directly connected to an output current terminal for the modulated current signal $I_{OP}$; one end of the capacitor $C_2$ is electrically connected to the source of the transistor $M_{S1}$, the other end of capacitor $C_2$ is directly connected to an output terminal for the modulated current signal $I_{ON}$.

20. The integrated circuit according to claim 19, wherein the output stage circuit is a three parallel connected output stages circuit; a first output stage is directly connected to the output of the pre-drive circuit while a second and a third output stages are connected to the output of pre-drive using switching circuits; pins of the integrated circuit comprise:

a pair of input pins, for transmitting the voltage signals $V_{IP}$, $V_{IN}$ to the input stage circuit;

a pair of output pins, which represent an output modulation current to a laser diode;

a plurality of tail current source pins, for accessing the tail current sources required by the driving circuit of the laser driver;

a plurality of voltage source pins, for accessing the voltage sources required by the driving circuit of the laser driver; and two control signals pins, are used to activate the switching circuits designated for a second and a third output driver stages.

\* \* \* \* \*